United States Patent [19]

Worns

[11] Patent Number: 4,689,290

[45] Date of Patent: Aug. 25, 1987

[54] PHOTOSENSITIVE ELASTOMERIC POLYMER COMPOSITION FOR FLEXOGRAPHIC PRINTING PLATE

[75] Inventor: John R. Worns, Mishawaka, Ind.

[73] Assignee: Uniroyal Plastics Co., Inc., Mishawaka, Ind.

[21] Appl. No.: 868,846

[22] Filed: May 29, 1986

Related U.S. Application Data

[63] Continuation of Ser. No. 741,381, Jun. 5, 1985, abandoned.

[51] Int. Cl.$^4$ .................................................. G03C 1/68
[52] U.S. Cl. ..................................... 430/286; 430/306; 430/287; 430/907; 430/905; 430/910; 522/110
[58] Field of Search ............... 430/286, 306, 287, 907, 430/905, 910; 522/110

[56] References Cited

U.S. PATENT DOCUMENTS 4,177,074 12/1979 Proskow .............................. 430/286
4,415,649 11/1983 Munger et al. ................. 430/286 X
4,517,279 5/1985 Worns ................................. 430/286

Primary Examiner—John E. Kittle
Assistant Examiner—Cynthia Hamilton
Attorney, Agent, or Firm—Pennie & Edmonds

[57] ABSTRACT

The present invention relates to a flexible photopolymer printing plate composition comprising a homogenous blend of:

(A) a high molecular weight butadiene-acrylonitrile copolymer having a number average molecular weight of about 30,000 to 125,000, an acrylonitrile content of 10 to 50% by weight, a carboxyl content of 2 to 15% by weight, and a Mooney viscosity (ML-4 at 100° C.) of 45 or higher; and (B) a medium molecular weight butadiene-acrylonitrile copolymer having a number average molecular weight of about 15,000 to 40,000, an acrylonitrile content of 10 to 40% by weight, a carboxyl content of 1–15%, and a Mooney viscosity (ML-4 at 100° C.) of from 15 to less than 45.

9 Claims, No Drawings

PHOTOSENSITIVE ELASTOMERIC POLYMER COMPOSITION FOR FLEXOGRAPHIC PRINTING PLATE

This is a continuation of application Ser. No. 741,381 filed 6/05/85, abandoned.

DESCRIPTION OF THE INVENTION

Field of the Invention

This invention relates to high molecular weight butadiene-acrylonitrile copolymers (NBR) containing carboxyl groups blended with medium molecular weight butadiene-acrylonitrile copolymers also containing carboxyl groups to produce photosensitive elastomeric articles which are designed to be used primarily as flexographic printing plates.

Background of the Invention

British Pat. No. 1,358,062 discloses photosensitive compositions consisting of a nitrile rubber with a photopolymerizable tri- or tetra-unsaturated ester derived from acrylic or methacrylic acid and in addition, a polymerization initiator activatable by actinic radiation.

U.S. Pat. No. 3,825,430 discloses a photosensitive composition containing a continuous phase of a light sensitive organic material and a discontinuous phase of a finely divided, elastomeric organic compound uniformly distributed through the continuous phase, i.e. a carboxyl containing, high molecular weight butadiene-acrylonitrile copolymer.

U.S. Pat. No. 4,177,074 discloses a photosensitive composition containing a high molecular weight butadieneacrylonitrile copolymer which contains carboxyl groups a low molecular weight butadiene polymer which may or may not contain carboxyl groups and an ethylenically unsaturated monomer, and a free-radical generating system. This composition is said to be useful for flexographic printing plates.

U.S. Pat. No. 4,272,608 discloses photosensitive elastomeric compositions comprising a high molecular weight carboxylated butadiene-acrylonitrile copolymer in which at least 25% of the carboxyl groups are neutralized with a metal cation of Groups IIA or IIB of the periodic table and an ethylenically unsaturated monomer and a free radical generating system.

The art is continually seeking photosensitive elastomeric compositions for use in flexographic printing plates which have more rapid cure rates, i.e., require less exposure time without the attendant disadvantages normally associated with said improved sensitivity, e.g., shoulder build-up.

SUMMARY OF THE INVENTION

The present invention is a flexible photopolymer printing plate composition comprising a blend of:

(A) a high molecular weight butadiene-acrylonitrile copolymer having a number average molecular weight ($\overline{Mn}$) of about 30,000 to 125,000, an acrylonitrile content of 10 to 50% by weight, a carboxyl content of 2 to 15% by weight and a Mooney viscosity (ML-4 at 100° C.) of 45 or higher;

(B) a medium molecular weight butadiene-acrylonitrile copolymer having a number average molecular weight of about 15,000 to 40,000, an acrylonitrile content of 10 to 40% by weight, a carboxyl content of 1-15% by weight and a Mooney viscosity (ML-4 at 100° C.) of from 15 to less than 45;

(C) a photopolymerizable, ethylenically unsaturated cross-linking agent compatible with polymers (A) and (B); and (D) an addition polymerization initiator activatable by actinic radiation.

This invention provides photosensitive materials for producing flexographic printing plates with the advantages of increased production rates, reduced costs, and labor savings over conventional platemaking procedures. The blends of the high medium molecular weight carboxylated copolymers also have improved ink compatibility over prior art blends, due to the absence of liquid copolymers. Not only do these compositions also show improved sensitometric properties (faster cure rate) requiring less exposure to actinic radiation to reproduce finely detailed images but serendipitously exhibit very little shoulder build-up.

DETAILED DESCRIPTION OF THE INVENTION

The compositions of this invention comprise a high molecular weight butadiene-acrylonitrile copolymer (A) having a number average molecular weight of from 30,000 to 125,000, preferably from 45,000 to 110,000. The acrylonitrile content of this copolymer is from about 10 to 50% preferably from about 20 to 40% by weight, a carboxyl content of from about 2 to 15% preferably about 3 to 10%, most preferably from about 4 to 8% by weight. The Mooney viscosity (ML-4 at 100° C.) is 45 or higher, preferably 45 to 75.

The blends of this invention further contain a medium molecular weight carboxylated butadiene-acrylonitrile copolymer (B) having a number average molecular weight of from 15,000 to 40,000 preferably of from 20,000 to 30,000; an acrylonitrile content of from about 10 to 40%, preferably from about 20 to 35% by weight: a carboxyl content of from about 1 to 15% preferably about 4 to 10% by weight (B); and a Mooney viscosity (ML-4 at 100° C.) of 15 to less than 45; preferably 15 to 40.

The (A)/(B) weight ratio may range from 80/20 to 30/70, usually from 70/30 to 40/60, most preferably 65/35-45/55, provided that the Mooney viscosity of such blend falls within a range of from about 20-55, preferably from about 25-50 and most preferably from about 30-50 (ML-4 at 100° C.).

Furthermore, the photosensitive compositions of this invention comprise ethylenically unsaturated crosslinking agents (C) including unsaturated esters of polyols, particularly such esters with alpha-methylene carboxylic acids, e.g. ethylene glycol diacrylate, diethylene glycol diacrylate, glycerol diacrylate, glycerol triacrylate, mannitol polyacrylate, sorbitol polyacrylate, ethylene glycol dimethacrylate, 1,3-propanediol dimethacrylate, 1,3,4-butanetriol trimethacrylate, 1,4-butanediol diacrylate or dimethacrylate, 1,4-cyclohexanediol diacrylate, 1,4-benzenediol dimethacrylate, isosorbidene diacrylate, pentaerythritol di-, tri- and tetramethacrylate, dipentaerythritol polyacrylate, dipentaerythritol polyacrylate, pentaerythritol di, tri- and tetra-acrylates, 1,3-propanediol diacrylate, 1,6-hexanediol diacrylate or dimethacrylate, 1,5-pentanediol dimethacrylate, trimethylolpropane triacrylate, the bisacrylates and methacrylates of polyethylene glycols of molecular weight 200 to 4000, unsaturated amides, particularly those of the alpha-methylene carboxylic acids and especially those of alpha, omega-diamines and oxygen-interrupted omega-diamines such as methylene bisacrylamide, methylene bismethacrylamide, ethylene bismethacrylamide, 1,6-mexamethylene bisacrylamide, diethylene triamine, trismethacrylamide, 1,2-di(gamma-methacrylamidopropoxy)ethane, beta-methacrylaminoethyl methyacrylate, N-(beta-hydroxyethyl)-2-(methacrylamido) ethyl acrylate and N,N-bis(beta-methacryloxethyl)acrylamide; vinyl esters such as divinyl succinate, divinyl adipate, divinyl phthalate, divinyl terepthalate, divinyl benzene-1,3-disulfonate, divinyl butane-1,4-disulfonate and unsaturated aldehydes, such as sorbaldehyde (hexadienal). Preferred addition polymerizable crosslinking agents are the esters and amides of alpha-methylene carboxylic acids and substituted carboxylic acids with polyols and polyamines wherein the molecular chain between the hydroxyls and amino groups is solely carbon or oxygen-interrupted carbon.

The amount of unsaturated crosslinking agent added should be about 2 to 40 parts by weight preferably about 5 to 25 parts by weight based on 100 parts of the elastomer content. The exact amount will vary for best results depending on the particular composition used.

The most preferred unsaturated crosslinking agents are 1,4-hexandiol diacrylate, 1,4-hexanediol dimethyacrylate, trimethylolpropane triacrylate and pentaerythritol triacrylate. The preferred compositions are those in which the high molecular weight copolymers are compatible with the unsaturated compounds to form clear, non-light scattering compositions in layers less than 0.250 inch (ca. 6.4 mm) thick.

Another component (D) of the photosensitive composition of this invention is an addition polymerization and/or crosslinking initiator activatable by actinic radiation and thermally inactive at or below 185° C. Such initiators include aromatic ketones such as benzophenone and substituted benzophenones, the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Such suitable initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-napthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone, alpha-sulfonic acid, 3-chloro-2-methylanthraquinone, retenequinone, 7,8,9,10-tetrahydronaphthacenequinone, and 1,2,3,4-tetrahydrobenz-alpha-anthracene-7,12-dione. Other photoinitiators which are useful for the purpose of this invention are described in U.S. Pat. No. 2,760,863 and include vicinal ketaldonyl compounds such a diacetyl benzil, etc., alpha-ketaldonyl alcohols, such as benzoin, pivaloin, etc., acyloin ethers, e.g. benzoin methyl and ethyl ethers, etc., alpha-hydrocarbon substituted aromatic acyloins, including alpha-methylbenzoin, alpha-allylbenzoin and alpha-phenylbenzoin and 2,2 dialkoxy-2-phenylacetophenone.

The amount of photoinitiator added should be from about 0.01 to 10 parts by weight based on 100 parts of the total elastomer, the preferred range being from about 0.2 to 4.

The photosensitive composition can be prepared by mixing the components, i.e. (A) the high molecular weight butadiene-acrylonitrile carboxyl containing copolymer, (B) the medium molecular weight butadiene-acrylonitrile carboxyl containing copolymer, (C) the compatible ethylenically unsaturated crosslinking agent, and (D) the free-radical generating system to a preferably homogeneous blend either by solvent blending in suitable solvents such as chlorinated hydrocarbons, e.g., trichloroethylene, trichloroethane and chlorotoluene: ketones, e.g., methyl ethyl ketone, diethyl ketone, and methyl isobutyl ketone; aromatic hydrocarbons, e.g., toluene and tetrahydrofuran or by open milling or by internally mixing for a time long enough to blend the ingredients thoroughly, preferably homogeneously.

The non-light scattering compositions are then formed into sheets in any desired manner of thicknesses from 0.0005 to 0.250 inch (0.0013–0.64 cm). Such methods are, for example, solvent-casting, hot pressing, calendering or extrusion at room temperature or at elevated temperature. The sheet may be supported during forming by a suitable supporting substrate or the sheet may be applied to a supporting substrate after forming. The supporting substrate can be any natural or synthetic support which exists in a flexible or rigid film or sheet form. Commonly used supports for use by this composition in flexographic printing include metal sheets such as steel or tin coated steel and plastic films such as polyester or polyamide. The preferred supporting substrates are dimensionally stable and resistant to the washout solutions.

As these are photo-activated systems, it is necessary to protect the above mentioned sheets from surface contamination by dirt and dust during storage before being exposed and washed into a finished relief imaged element. This is accomplished by lamination or application of a flexible protective cover sheet to the side of the element opposite that of the substrate. As these elements can be tacky, it is also desirable to apply a release film to the surface of the element before application of the protective cover sheet. This release film may be about 0.0002 inch (0.0051 cm) thick flexible polymeric film. Typical polymeric materials are polyamide copolymers or vinyl acetate copolymers. Similarly familiar release agents may also be used for this purpose, e.g., silicone, fluorocarbons and waxes as long as they are transparent and do not interfere with exposure to actinic radiation. These release agents or films promote good intimate contact between the surface of the element opposite to the substrate and the image bearing negative or transparency applied to the element. This intimate contact is essential for accurate reproduction of the image on the element.

Relief printing plates are produced from the composition of this invention from the above described sheets. The construction usually comprises a polyester substrate from 0.001 to 0.020 inch (0.025–0.051 mm) and preferably 0.004–0.006 inch (0.010–0.015 cm), adhered to a sheet of the composition of this invention from 0.005 to 0.250 inch (0.25–0.64 cm) thick coated with a ca. 0.0002 inch (0.005 mm) thick polyamide copolymer release film on the side opposite of the substrate. This polyamide film may be covered and adhered to a second polyester film (ca. 0.005 inch; 0.013 cm) which is a protective cover sheet. This construction is then exposed to actinic radiation through the substrate, if necessary depending on thickness, to crosslink via addition polymerization the non-relief backing area of the plate. This exposure will control the depth of relief produced in the plate (thin plates do not require this step). The plate is then turned over, and the protective cover sheet removed. Photographic negatives or transparencies or other image bearing media, with transparent and opaque areas used to produce the image, are laid in intimate contact with the polyamide release coated surface of the sheet of the composition of the invention. Good contact between the negative and release surface can be provided by a vacuum system that presses the negative against the sheet surface. This sandwich is then exposed to actinic radiation, e.g., ultraviolet radiation at a wavelength between 2500Å and 5000 Å, with preferred being 3600 Å. On exposure, the transparent areas of the negative permit addition polymerization or crosslinking to take place. Exposure is of sufficient duration to crosslink the image to the substrate or the previously crosslinked sheet backing. Crosslinking will occur only in the exposed areas of the sheet (transparent areas of the negative) with no significant crosslinking occurring in the non-image, unexposed areas of the sheet (opaque areas of the negative).

Actinic radiation may be provided from any source such as, carbon arcs and high pressure mercury lamps. Preferred sources are very high output so-called blacklight fluorescent types due to their high ratio of ultraviolet to infrared output. Exposure times will vary, depending on the output of the lamps, distance from the lamp, the relief depth desired and the thickness of the plate. Exposure times may vary from a few seconds to several minutes.

On completion of the exposure, the negative is removed, and the exposed sheet is ready for development of the relief image by treating with a semi-aqueous basic solution or solvent wash. These wash systems remove the unexposed, uncrosslinked composition from the exposed sheet and do not adversely affect the exposed, crosslinked composition that forms the raised relief image. The semi-aqueous basic wash method is preferred.

Solvent wash may be accomplished as in the prior art with organic solvents such as 2-butanone, benzene, toluene, xylene, trichlorethane, trichlorethylene, tetrachlorethylene, methylchloroform, and solvent mixtures such as tetrachlorethylene with n-butanol.

Suitable semi-aqueous washout mixtures include sodium hydroxide/isopropyl alcohol/water, sodium carbonate/2-butoxyethanol/water, sodium borate/2-butoxyethanol/water, sodium silicate/-2-butoxyethanol/glycerol/water, sodium carbonate/2-(2-butoxyethoxy) ethanol/water, sodium hydroxide/2-(2-butoxyethoxy) ethanol/water and sodium hydroxide/1,2-ethanediol/water. Normal use of these mixtures is at elevated temperature. The preferred solution is sodium hydroxide/2-(2-butoxyethoxy) ethanol/water (0.5% sodium hydroxide in water/2(2-butoxyethoxy)ethanol (5/1 ratio by volume) at 50°–70° C.

As can be seen from the above, the flexible photopolymer printing plates of the present invention can be readily processed in basic aqueous, or semi-aqueous medium solutions as well as in halogenated hydrocarbon solutions or blends of halogenated hydrocarbons and alcohols. The plates exhibit excellent solvent resistance to a wide variety of printing inks, including water, alcohol, and hydrocarbon based inks. The compositions also exhibit excellent abrasion resistance and better clarity than certain other photosensitive printing plates.

The above composition has preferred utility in raised image printing processes such as letterpress, letterset and flexographic printing, however, the compositions also have utility in other applications where image formation is utilized such as photoresists, planographic plates, "silk screen" printing and stencils.

The following examples are illustrative of the present invention and are not intended as a limitation upon the scope thereof.

EXAMPLE 1

A polymer solution was prepared by mixing the following ingredients (all in parts by weight).

| | |
|---|---|
| CNBR-1[1] | 60 |
| CNBR-2[2] | 40 |
| TMPTA[3] | 10 |
| Photoinitiator[4] | 1 |
| Toluene | 190 |
| Methyl ethyl ketone | 47 |

[1]Carboxylated NBR; Mooney viscosity (ML-4 at 100° C.) = 55, acrylonitrile (ACN) content: 32%, carboxyl content: 9%, Mn ca. 75,000.
[2]Carboxylated NBR; Mooney viscosity (ML-4 at 100° C.) = 35, ACN = 27%, carboxyl: 3.4, Mn ca. 30,000.
[3]Trimethylolpropane trimethacrylate (TMPTA)
[4]2,2-dimethoxy-2-phenylacetophenone (DMPA)

by first blending the solvents and the antioxidant, and while heating the mixture to about 50° C., adding the remaining materials. Agitation was maintained until solids were analyzed to be 32% (by weight).

The homogenous solution was then cast on a support sheet of polyester film (0.005 inch, 0.127 mm) via a doctor blade, in multiple passes to build the photosensitive composition to a dry film thickness of 0.075 inch (0.19 cm). The doctor blade was set 0.006 inch (0.015 cm) over the polyester substrate or support film at the start of the casting and adjusted to 0.006 inch over the cast material as the thickness was built to 0.075 inch. Each additional pass was air dried for 5 minutes before the next pass was applied. When the desired 0.075 inch (0.19 cm) thickness was reached, the plate was then oven dried at 55°–65° for 6 hours to remove any remaining solvent.

The final composition had a Mooney viscosity (ML-4 at 100° C.) of 47.

The plate was then sprayed with a dry release, high molecular weight wax coating on the side opposite the polyester support sheet. The plate was then exposed on the back, through the polyester support, for 30 seconds with ultraviolet lamps (Sylvania blacklight very high output lamps, FR-48T12 - B/L-VHO-180). The lamps were spaced apart on 2-inch (5.08 cm) centers. The plate was placed 2 inches (5.08 cm) from the lamps. After back exposure, the plate was placed photosensitive composition up (polyester backing down) under the lamps. A ByChrome (trademark) negative having three identical percentage-calibrated screen tints was placed in intimate contact with the release coated surface using the vacuum frame of the exposure unit. The plate was exposed to the ultraviolet light through three negatives for 8, 10 and 15 minutes, respectively. After exposure, the negatives were removed, and the plate was washed for 15 minutes in a rotary brush processor using a mixture of 75% tetrachloroethylene and 25% n-butanol. After washing, the plate was dried in a forced air oven at 65° C. for 1 hour.

The resultant printing plate had exceptional clarity, excellent image sharpness at an average relief image of 0.030 inch (0.076 cm) reproducing the 5 to 90% tones in all three negatives from 65 line to 150 line half tone. Plate hardness was 52 (Shore A), and the plate did not crack when flexed 180° upon itself; surprisingly, the rate of should build-up was much slower than ordinarily expected, even over the rather wide range of exposure times.

EXAMPLE 2

The composition and procedure of Example 1 was repeated except that the exposed plate was washed in a semi-aqueous mixture 0.5% NaOH in a ¼ (by volume) 2-(2-butoxyethoxy)ethanol/water mixture. The resultant printing plate exhibited the same excellent characteristics as the solvent washed plate of Example 1.

EXAMPLE 3

Additional plate compositions are prepared using the procedure of Example 1, i.e., blends of high and medium molecular weight (high and medium ML-4) carboxylated nitrile rubbers, namely:

|  | Run No. | | |
| --- | --- | --- | --- |
|  | 3-1 | 3-2 | 3-3 |
| CNBR-3 | 70 | — | — |
| CNBR-4 | — | 60 | — |
| CNBR-5 | — | — | 30 |
| CNBR-6 | — | 40 | — |
| CNBR-2 | 30 | — | 70 |
| TMPTA | 10 | 10 | 10 |
| DMPA | 2 | 2 | 2 |
| ML-4 (100° C.)[(1)] | 41 | 44 | 47 |

| | REMARKS: | | | | |
| --- | --- | --- | --- | --- | --- |
| CNBR: | BDE[(2)] | ACN | COOH | ML-4[(3)] | n |
| −3 | 66.6 | 27 | 3.4 | 45 | 30,000 |
| −4 | 67 | 32 | 1.0 | 50 | 30,000 |
| −5 | 63.5 | 32 | 4.5 | 75 | — |
| −6 | 66 | 29 | 5 | 34 | — |

[(1)]After evaporation of solvent
[(2)]1,3-butadiene
[(3)]Mooney viscosity (ML-4 at 100° C.)

After exposure and a semi-aqueous washing step, about the same photosensitive plate characteristics are observed as with the blends of Example 1.

EXAMPLE 4

After following essentially the procedure outlined in Example 1, the shoulder angles of several photopolymer compositions were evaluated, namely, Runs No. 4-1, 4-2 and 4-3, wherein No. 4-1 is identical to the composition of Example 1. No. 4-2 represents a typical composition of copending patent application Ser. No. 634,732 filed July 26, 1984, and Nos. 4-3 and 4-4 are a composition believed to be representative of U.S. Pat. No. 4,177,074 (Proskow).

Resolution of images is very critical and determine the quality of a photosensitive plate. The resolution of a plate ultimately depends on the materials from which the plates are made. One way to measure such resolution is by examining the angle the shoulder makes with the printing surface of the relief image. For best results, an angle of about 60°–70° or greater is desired, a 55°–60° range is acceptable, whereas an angle of less than 55° is less than acceptable by the standards of this invention and the industry.

Commercially acceptable 10 second Durometer hardness values (Shore A values determined after 10 second plunger contact with material) for flexographic photopolymer printing plates lie in the range of from about 18 to 55, preferably from about 20–45. Shore A 10 second values below 18 are considered to be too soft for necessary image retention.

All three plates were treated identically except for face and back exposure times. The treatment and results are summarized below:

|  | Run No. | | | | |
| --- | --- | --- | --- | --- | --- |
|  | 4-1 | 4-2 | 4-3 | 4-4 | |
| Back exposure, minutes | 0.33 | 0.33 | 4.0 | 0.33 | |
| Face exposure, minutes | 4.0 | 4.0 | 6.0 | 4.0 | |
| Shoulder angle, degrees | 60 | 45 | 50 | 55 | (gummy) |
| Durometer Hardness (Shore A after 10 seconds) | 22 | 25 | 29 | 10 | |

Clearly, the compositions of this invention can provide improved image resolution over prior art compositions.

The high-low molecular weight photosensitive blends such as exemplified by the 4-3 and 4-4 composition not only are slow cure blends, i.e., require long exposure times but invariably experience shoulder build-up problems. One would expect that in a blend having a faster cure rate at a given exposure, the shoulder build-up problems would be exacerbated. Surprisingly, as can be seen from the above, fast cure blends of this invention have significantly less shoulder build-up than the high-low blends of the prior art.

Although the invention has been illustrated by the preceding examples, it is not to be construed as being limited to the materials employed therein, but rather, the invention encompasses the generic area as hereinbefore disclosed. Various modifications and embodiments can be made without departing from the spirit and scope thereof.

What is claimed is:

1. A photosensitive elastomeric composition which comprises:
    (A) a butadiene-acrylonitrile copolymer having a number average molecular weight of about 30,000 to 125,000, an acrylonitrile content of 10 to 50% by weight, a carboxyl content of 2 to 15% by weight, and a Mooney viscosity (ML-4 at 100° C.) of 45 or higher;
    (B) a butadiene-acrylonitrile copolymer having a number average molecular weight of about 30,000 to 40,000, an acrylonitrile content of 10 to 40% by weight, a carboxyl content of 1–15% by weight and a Mooney viscosity (ML-4 at 100° C.) of from 15 to less than 45;
    (C) from about 2 to 40 parts by weight based on 100 parts of the elastomer content, of a photopolymerizable, ethylenically unsaturated crosslinking agent compatible with copolymers (A) and (B); and
    (D) from about 0.01 to about 10 parts by weight based on 100 parts of the elastomer content of an addition polymerization initiator activatable by actinic radiation, wherein the weight ratio of copolymer (A) to copolymer (B) is from 80:20 to 30:70 and the Mooney viscosity (ML-4 at 100°C.) of the composition is from about 20 to 55.

2. The elastomeric compositions of claim 1 wherein: copolymer (A) has a number average molecular weight of about 45,000 to 110,000 and a Mooney viscosity (ML-4 at 100° C.) from about 45 to 75; and copolymer (B) has a number average molecular weight of about 30,000 and a Mooney viscosity (ML-4 at 100° C.) from about 15 to 40.

3. The elastomeric composition of claim 2 wherein:

copolymer (A) has an acrylonitrile content of from 20 to 40% by weight; and copolymer (B) has an acrylonitrile content of from 20 to 35% by weight.

4. The elastomeric composition of claim 2 wherein:

copolymer (A) has a carboxyl content of from 3 to 10% by weight; and copolymer (B) has a carboxyl content of from 4 to 10% by weight.

5. The elastomeric composition of claim 1 wherein the Mooney viscosity (ML-4 at 100° C.) of said composition is from about 25 to 50.

6. A photosensitive elastomeric composition which comprises:

(A) a butadiene-acrylonitrile copolymer having a number average molecular weight of from about 45,000 to 110,000, an acrylonitrile content of from about 20 to 40% by weight, a carboxyl content of from about 4 to 8% by weight, and a Mooney viscosity (ML-4 at 100° C.) of 45 to 75;

(B) a butadiene-acrylonitrile copolymer (B) having a number average molecular weight of about 30,000, an acrylonitrile content of from about 20 to 35% by weight, a carboxyl content of from about 4 to 10% by weight and a Mooney viscosity (ML-4 at 100° C.) of from 15 to 40;

(C) from about 5 to 25 parts by weight based on 100 parts of the elastomer content of a photopolymerizable, ethylenically unsaturated crosslinking agent compatible with copolymers (A) and (B); and (D) from about 0.2 to 4 parts by weight based on 100 parts of the elastomer content of an addition polymerization initiator activatable by actinic radiation;

wherein the weight ratio copolymer (A) to copolymer (B) is from 65:35 to 45:55 and the Mooney viscosity (ML-4 at 100° C.) of the composition is from about 30 to 50.

7. A photosensitive flexographic plate which comprises a substrate having thereon a layer of the photosensitive composition of claim 1.

8. A photosensitive flexographic plate which comprises a substrate having thereon a layer of the photosensitive composition of claim 5.

9. A photosensitive flexographic plate which comprises a substrate having thereon a layer of the photosensitive composition of claim 6.

* * * * *